United States Patent
Tong et al.

(10) Patent No.: US 6,724,592 B1
(45) Date of Patent: Apr. 20, 2004

(54) SUBSTRATE-TRIGGERING OF ESD-PROTECTION DEVICE

(75) Inventors: Paul C. F. Tong, San Jose, CA (US); Ming-Dou Ker, Hsinchu (TW); Ping Ping Xu, San Jose, CA (US); Kwong Shing Lin, Sunnyvale, CA (US); Anna Tam, Cupertino, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/248,018

(22) Filed: Dec. 11, 2002

(51) Int. Cl.$^7$ ................................................ H02H 9/00
(52) U.S. Cl. ............................... 361/56; 361/111
(58) Field of Search .................. 361/56, 111, 91.1, 361/91.3, 86, 119; 257/355

(56) References Cited

U.S. PATENT DOCUMENTS

| | | | |
|---|---|---|---|
| 5,686,751 A | 11/1997 | Wu | 257/356 |
| 5,852,541 A | 12/1998 | Lin et al. | 361/111 |
| 5,959,488 A | 9/1999 | Lin et al. | 327/313 |
| 6,043,967 A | 3/2000 | Lin | 361/111 |
| 6,072,219 A | 6/2000 | Ker et al. | 257/355 |
| 6,091,593 A | * 7/2000 | Lin | 361/111 |
| 6,140,683 A | 10/2000 | Duvvury et al. | 257/360 |
| 6,249,410 B1 | 6/2001 | Ker et al. | 361/56 |
| 6,274,911 B1 | 8/2001 | Lin et al. | 257/358 |
| 6,310,379 B1 | 10/2001 | Andresen et al. | 257/355 |
| 6,337,787 B2 | 1/2002 | Tang | 361/56 |
| 6,411,480 B1 | 6/2002 | Gauthier et al. | 361/56 |

OTHER PUBLICATIONS

Chen et al, "Investigation of the Gate-Driven Effect and Substrate-Triggered Effect on ESD Robustness of CMOS Devices", IEEE Trans. Device & Materials Reliab., Vol 1, No. 4, Dec. 2002, pp. 190–203.

Ker et al., "ESD Protection Design for Mixed-Voltage I/O Circuit with Substrate-Triggered Technique in Sub-Quarter-Micron CMOS Process", IEEE Proc. Int'l Sym. Quality Electronic Design (ISQED'02), 4/02, p. 1–6.

* cited by examiner

Primary Examiner—Stephen W. Jackson
Assistant Examiner—James A Demakis
(74) Attorney, Agent, or Firm—Stuart T. Auvinen

(57) ABSTRACT

Pin-to-pin electro-static-discharge (ESD) protection is provided for a bus-switch transistor that is connected to I/O pins at its source and drain. A p-type substrate is normally pumped below ground by a substrate bias generator when power is applied. However, during a pin-to-pin ESD test, power and ground are floating. A gate node is pulled high through a coupling capacitor by the ESD pulse. The gate node turns on a shunting transistor to couple the ESD pulse to the floating ground bus. The gate node also turns on a shorting transistor that connects the floating ground bus to the floating substrate. A resistor drains the coupling capacitor to the substrate, rather than to ground. Current is injected into the substrate by the resistor. The snapback voltage is lowered by substrate-triggering.

20 Claims, 8 Drawing Sheets

SUBSTRATE-TRIGGERING OF ESD-PROTECTION DEVICE

BACKGROUND OF INVENTION

This invention relates to integrated circuits (IC's), and more particularly to electro-static-discharge (ESD) protection circuits.

Improvements in semiconductor processes are producing smaller and smaller transistors and other integrated devices. Unfortunately, the miniaturization of these devices also increases their risk of damage by static electricity. Relatively small electric shocks that might not be noticed by a human can melt or otherwise destroy tiny structures in an integrated transistor.

The input and output pads of an integrated circuit (IC) chip are typically outfitted with protection devices specifically designed to shunt electro-static-discharges (ESD). These ESD-protection devices are effective when the ESD pulse is applied to an input or output (I/O) pin when the ground pin is connected to a ground. During testing for ESD-protection, an ESD test machine applies a positive or negative test to the device-under-test (DUT) with its pins configured in various combinations (see JESD22-A114-B for details). This can include a zap to an I/O pin while the ground pin is connected to the ESD machine as a ground.

Since an actual electric shock can occur between any two pins on a chip, full ESD testing usually includes applying an ESD pulse between every possible combination of two pins. Other pins of the chip can be left floating.

Since the ESD-protection devices are often designed to shunt ESD current from a pin to a power or ground bus, when the ground is floating the ESD-protection device may not work optimally. For example, when an ESD pulse is applied between two different I/O pins, and the power and ground pins are left floating, the ESD current must somehow travel from the one I/O pin to the other I/O pin. Often an indirect path carries the ESD pulse, such as an internal ground bus.

Such I/O-pin to I/O-pin ESD testing can be the most difficult test to pass, especially for Bus-Switch-type products. While "normal" I/O-pin to ground or I/O-pin to power tests may pass, ESD pulses between two I/O pins with the ground pin floating may cause damage. This damage can sometimes result in leakage on a pin after the ESD test.

FIG. 1 is a diagram of a prior-art chip with grounded ESD-protection devices on each I/O pin. Pin A and pin B are I/O pins on an IC chip. Pins A and B are connected by bus-switch transistor 10 which forms a connecting channel when its gate is driven high by inverter 18. When enable EN is high, inverters 16, 18 drive the gate of bus-switch transistor 10 high, connecting pins A, B. When EN is low, transistor 10 isolates pin A from pin B.

ESD protection device 12 is connected to pin A. A wide variety of ESD protection devices could be used. ESD protection device 12 includes structures to shunt an ESD pulse from pin A to an internal ground bus. The shunt could be provided by a large diode to ground, or by a large grounded-gate n-channel transistor (either thin gate oxide or field oxide gate could be used), or by some other structure.

When an ESD pulse is applied to pin A, and the ground pin is grounded, ESD protection device 12 shunts the ESD pulse to the internal ground, and then to the ground pin and back to the ESD tester (or other common ground). ESD protection device 12 protects bus-switch transistor 10 from damage by the ESD pulse.

Pin B is likewise protected by ESD protection device 14. During normal operation in a real system, when EN is low and bus-switch transistor 10 isolated pins A, B, ESD protection device 12 can shunt any shock applied to pin A to the internal ground. This prevents the shock from being coupled to pin B, which may be coupled to another active bus. Such shocks can occur during hot-swapping of PC or network cards.

ESD-Protection Can Fail When Internal Ground Floats—FIG. 2

While ESD protection devices 12, 14 provide good protection when the internal ground is connected to an external ground, protection can be poor when the internal ground is floating. FIG. 2 highlights failure of ESD-protection devices when the internal ground is floating. In this I/O-pin to I/O-pin ESD test the power and ground pins are left floating. The ESD machine is connected between pin A and pin B. The ESD pulse is applied to pin A while pin B is grounded. All other pins, including power and ground, are left floating.

The ESD pulse applied to pin A charges up any capacitances on pin A until a high enough voltage is reached so the ESD protection device 12 snapbacks. Then the ESD pulse charges internal ground bus 20. Internal ground bus 20 connects to other ESD protection devices including ESD protection device 14 for the grounded pin B. The ESD pulse then travels forward through ESD protection device 14 to reach pin B.

Internal ground bus 20 has some resistance, as does ESD protection device 14 and especially ESD protection device 12, which has to snapback before conduction occurs. The total potential drop in this discharge path can be equal to the sum of the Holding voltage of protection device 12 plus the IR drop across internal ground Bus 20 plus the forward voltage of protection device 14.

The rise in voltage on pin A is coupled to the gate of bus-switch transistor 10 by overlap capacitance 22. Overlap capacitance 22 includes the gate-to-drain overlap capacitance of bus-switch transistor 10, and may include other parasitic capacitances. Since other pins are floating during the ESD test, EN is floating, and inverter 18 does not drive the gate.

The rise in voltage of pin A is thus coupled to the gate of bus-switch transistor 10 by overlap capacitance 22. Once the gate voltage rises to more than a threshold above the source voltage of pin B, bus-switch transistor 10 turns on. The ESD pulse then has a more direct path from pin A to pin B.

Since bus-switch transistor 10 is often a large transistor to decrease the on resistance between pins A, B, the channel resistance of bus-switch transistor 10 may be less than the resistance of the path through internal ground bus 20 and ESD protection devices 12, 14. Then most of the ESD current is carried through bus-switch transistor 10. Since bus-switch transistor 10 may not be designed for such as high current, damage may result.

To prevent such damage, bus-switch transistor 10 can have a more rugged design. For example, the source and drain contacts can be moved farther from the gate edge, and a larger channel length can be used. However, these design changes can increase the capacitance and on resistance, which is undesirable. Even with these design changes, bus-switch transistor 10 may still fail the I/O-pin to I/O-pin ESD test.

FIG. 3 shows ESD-protection devices in more detail. Bus-switch transistor 10 has its gate driven by inverters 16, 18 and connects to I/O pins A, B. Pin A is protected by n-channel transistor 50, which turns on when its gate is pulled high by an ESD pulse on pin A that is coupled through capacitor 54. Resistor 56 discharges the gate of transistor 50 once the ESD event ends.

For pin B, protection is provided by n-channel transistor 60, which turns on when its gate is pulled high by an ESD pulse on pin B that is coupled through capacitor 64. Resistor 66 discharges the gate of transistor 60 once the ESD event ends.

The bulk node or p-type substrates of transistors 10, 50, 60 are usually connected together and to the metal ground bus. Since ground may float during a pin-to-pin ESD test, the p-substrate under transistors 10, 50. 60 also floats. The metal ground bus and bulk node (p-substrate) are connected to the ground pin of chip which floats during the pin-to-pin ESD test.

FIG. 4 shows ESD-protection devices on a chip with a substrate bias. Some integrated circuits use a substrate bias to improve transistor characteristics. For example, the p-substrate can be pumped to a voltage below ground, such as −2 or −3 volts during normal operation. However, when power is not applied, such as during an ESD test, substrate bias generator 21 is not operating and the p-substrate under transistors 10, 50, 60 is again left floating. Additional problems may develop during ESD testing since the connecting substrate paths may be more complicated due to substrate bias generator 21. The metal ground bus is connected to the ground pin of chip which floats during the pin-to-pin ESD test. The p-substrate is driven by the on-chip substrate charge pump and is not connected to any chip pin and thus floats during the ESD test.

FIG. 5 shows bidirectional cross-grounding ESD protection for a bus-switch transistor. A cross-coupled ESD-protection device is disclosed in "Pin-to-Pin ESD-Protection Structure Having Cross-Pin Activation", Ser. No. 10/063,622, filed May 3, 2002 by Tong et al.

Pins A and B are connected by the channel of bus-switch transistor 10, which has a gate driven by inverter 18, which inverts an enable signal EN that is first inverted by inverter 16. Capacitor 54, resistor 56, shunting transistor 50, and cross-grounding transistor 58 protect bus-switch transistor 10 when an ESD pulse is applied to pin A with respect to pin B (an I/O-to-I/O ESD zap configuration). Gate node XAB turns on both transistors 50, 58 when the ESD pulse is applied to pin A with respect to pin B.

For the reverse ESD test, the positive ESD pulse is applied to pin B, and pin A is grounded. Then capacitor 64 charges reverse gate node XBA with a portion of the ESD zap applied to pin B. Before resistor 66 discharges reverse gate node XBA, cross-grounding transistor 68 turns on, connecting grounded pin A to the internal ground bus and substrate taps. The metal ground bus and bulk node (p-substrate) are connected to the ground pin of chip, which floats during the pin-to-pin ESD test.

N-channel shunting transistor 60 also has its gate driven high since its gate is also reverse gate node XBA. The ESD pulse on pin B is shunted to the internal ground through the snapback of n-channel shunting transistor 60 and then through forward-conducting n-channel transistor 50 to the grounded pin A.

The internal ground bus can rise in voltage above the grounded pin A, even when cross-grounding transistor 68 is on. However, the rise in voltage of the internal ground bus is much less than if it were left floating. The internal ground bus is still sufficiently "grounded" even though it may be some voltage above the absolute ESD ground on pin A. ESD protection is still improved because the bulk of the ESD current is discharged through forward conducting n-channel transistor 50.

What is desired is improved ESD protection. Better ESD protection is desired for I/O-pin to I/O-pin ESD tests when ground is floating. ESD protection is desired for integrated circuits that use a substrate bias. An isolation circuit for a bus-switch transistor with a substrate bias is desired that is activated during I/O-pin to I/O-pin ESD tests or similar conditions.

DETAILED DESCRIPTION

The present invention relates to an improvement in ESD protection. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the floating substrate in a bus-switch product with undershoot protection feature could be coupled to the ESD pulse to provide better ESD protection. A substrate-triggered design helps to move the turn-on region of the parasitic lateral NPN associated with the NMOS ESD protection structure away from the channel surface. This allows it to dissipate the heat generated from a high ESD stress over a larger volume. This translates to a more robust NMOS ESD protection structure.

Figure 1:
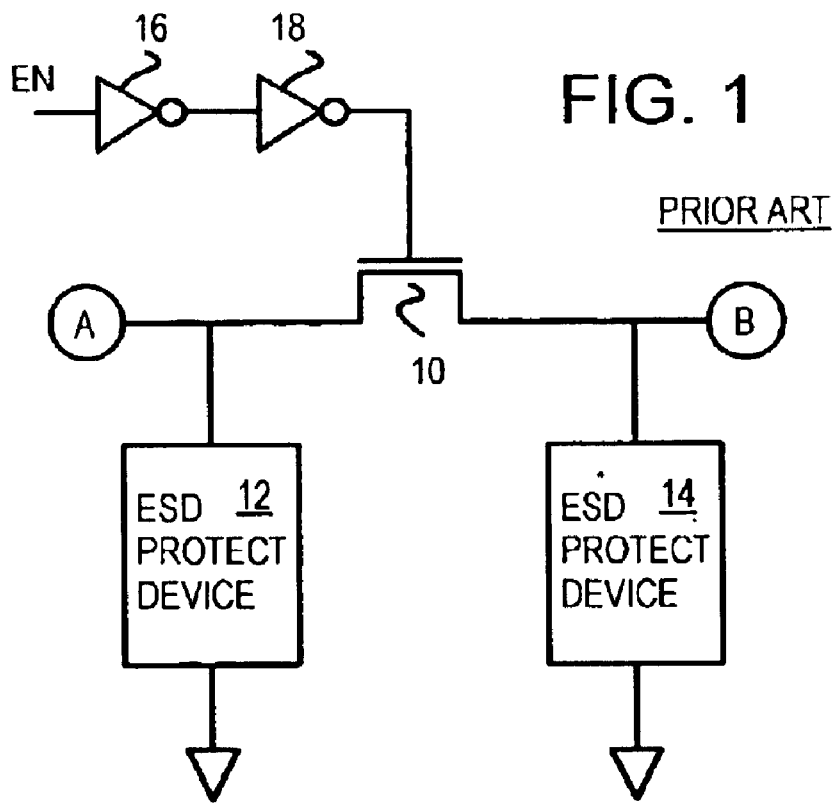
FIG. 1 is a diagram of a prior-art chip with grounded ESD-protection devices on each I/O pin.
Figure 2:
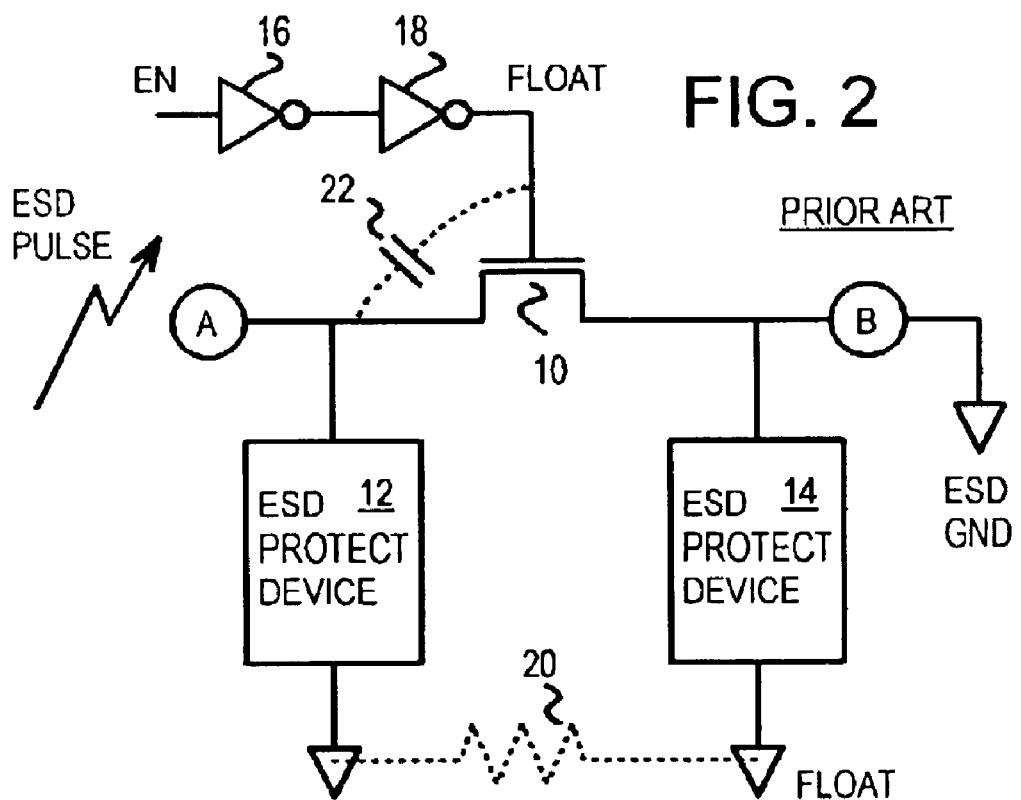
FIG. 2 highlights failure of ESD-protection devices when the internal ground is floating.
Figure 3:
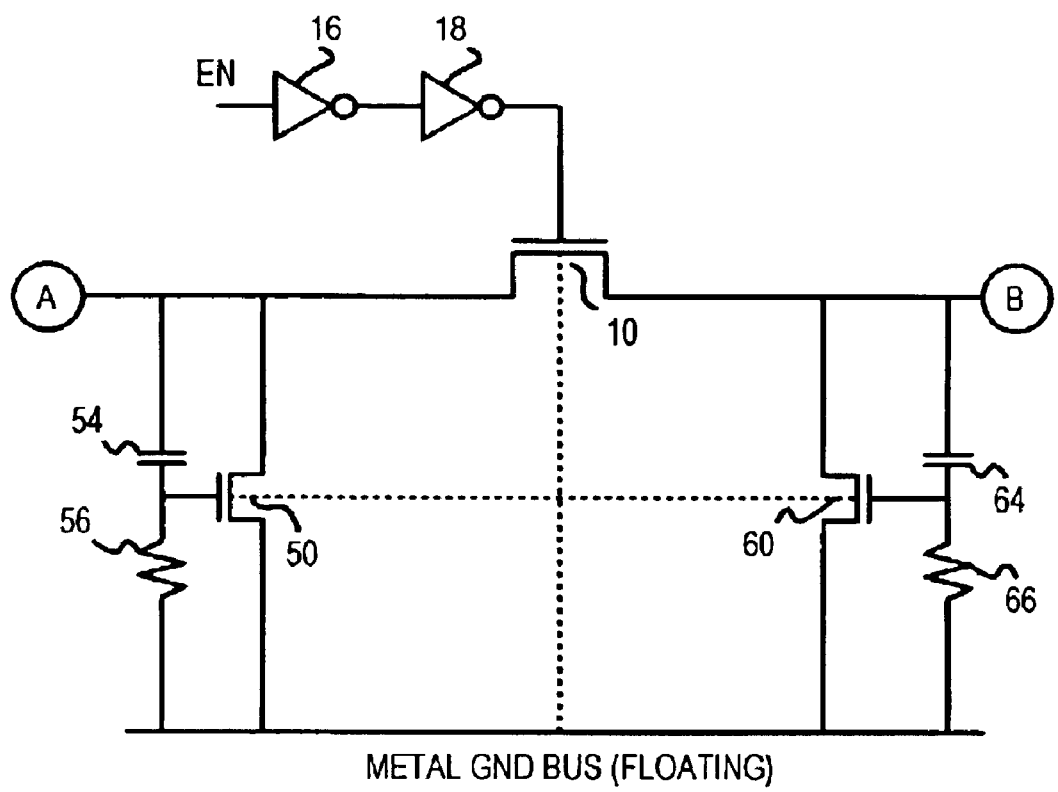
FIG. 3 shows ESD-protection devices in more detail.
Figure 4:
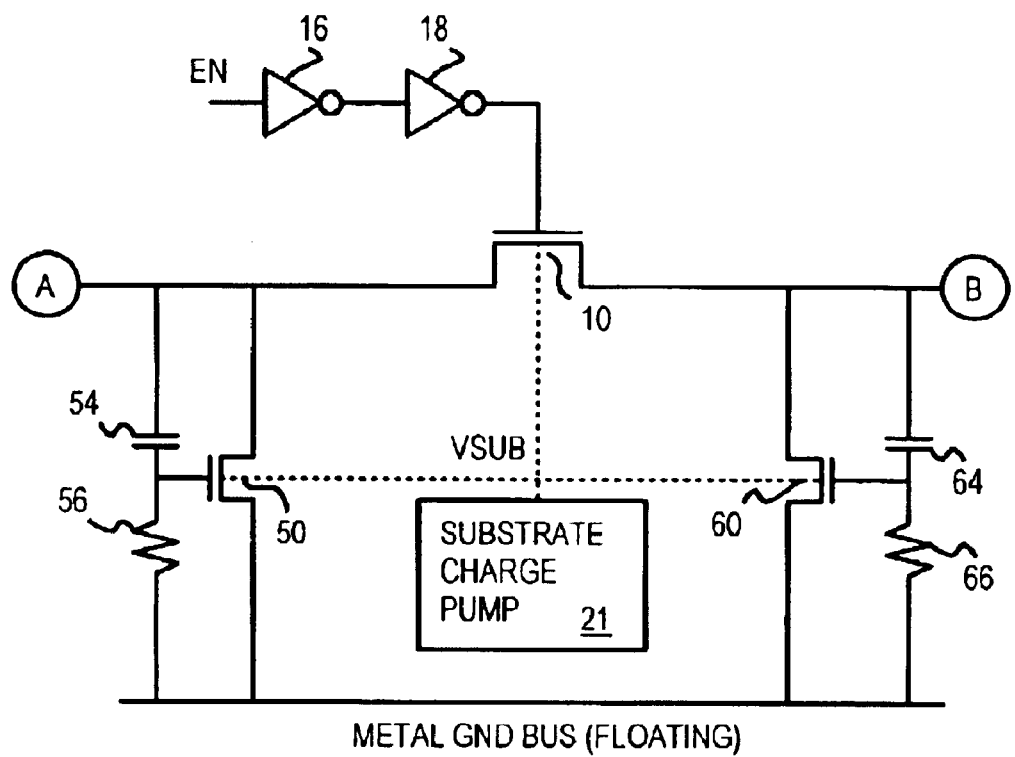
FIG. 4 shows ESD-protection devices on a chip with a substrate bias.
Figure 5:
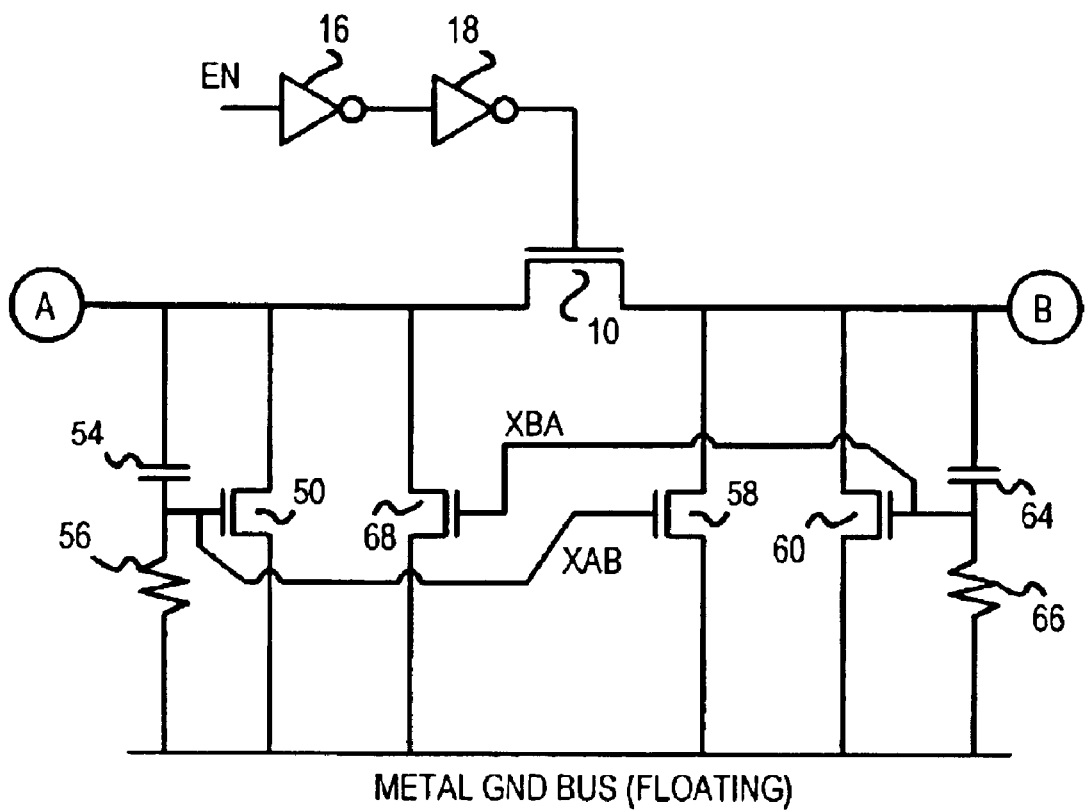
FIG. 5 shows bi-directional cross-grounding ESD protection for a bus-switch transistor.
Figure 6:
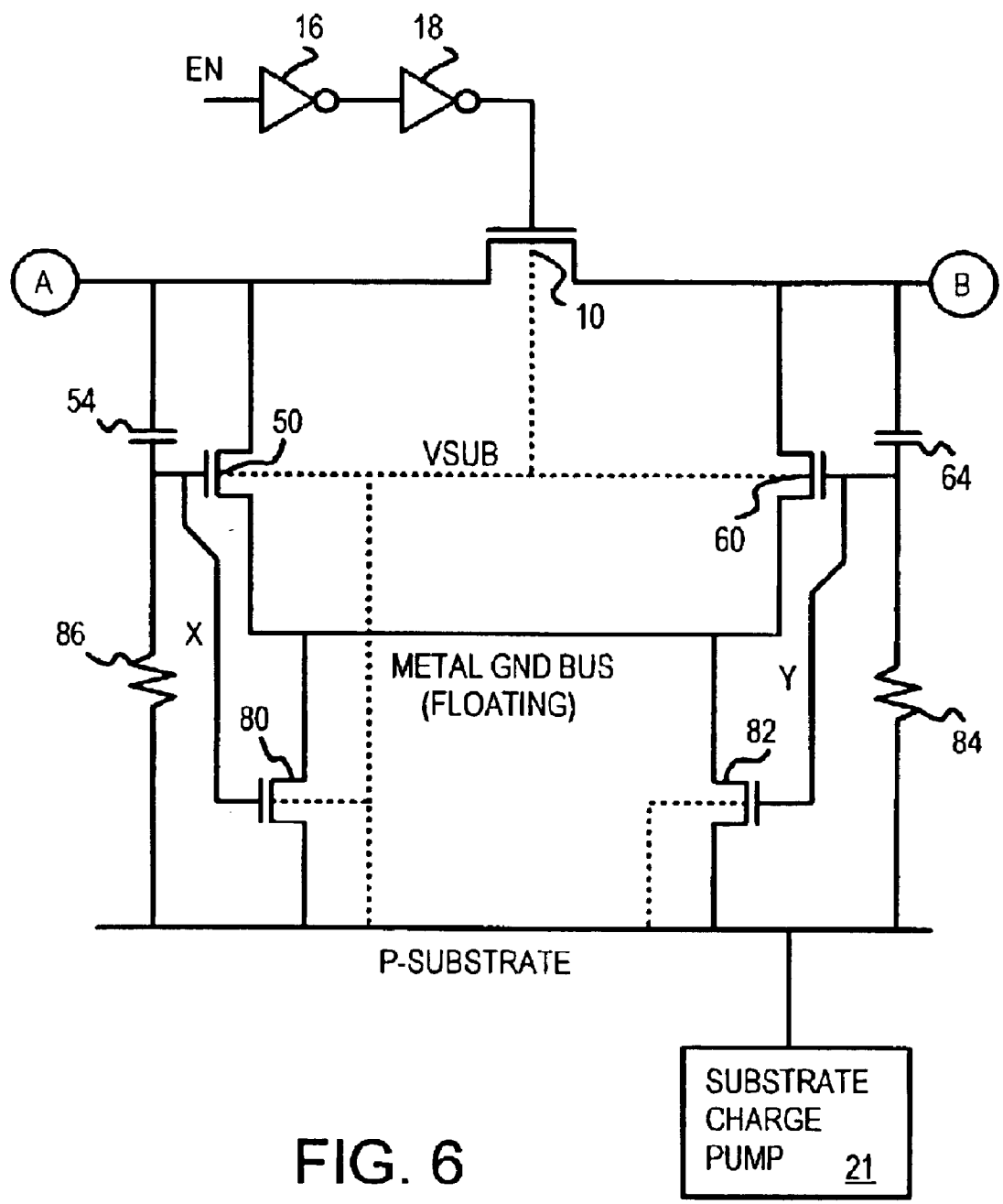
FIG. 6 is a diagram of a substrate-triggered ESD-protection device.

FIG. 6 is a diagram of a substrate-triggered ESD-protection device. Bus-switch transistor 10 connects pins A, B at is source/drain terminals. Inverters 16, 18 drive the gate of transistor 10, which is usually floating during ESD testing.

Substrate bias generator 21 uses a charge pump or other means to generate a negative bias voltage VSUB such as −2 volts that is applied to the p-type substrate. The bulk terminals of n-channel transistors 10, 50, 60, 80, 82 are biased below ground during normal chip operation by substrate bias generator 21. The metal ground bus is connected to the ground pin of chip which floats during the pin-to-pin ESD test. The p-substrate is driven by the on-chip substrate charge pump and is not connected to any chip pin and thus floats during the ESD test.

Shunting n-channel transistor SO is turned on by an ESD pulse applied to pin A, since coupling capacitor S4 couples part of the ESD voltage rise on pin A to node X, the gate of transistor 50. Likewise, shunting n-channel transistor 60 is turned on by an ESD pulse applied to pin B, since coupling capacitor 64 couples part of the ESD voltage rise on pin B to node Y, the gate of transistor 60.

The sources of shunting transistors 50, 60 are connected to the ground bus, which is floating during a pin-A-to-pin-B ESD test. This ground bus is typically a metal line or lines and therefore provides a low-resistance conduction path between pins A, B for a large ESD current.

Shorting n-channel transistors 80, 82 connect the metal ground bus to the p-type substrate under n-channel transistors 10, 50, 60, 80, 82 during an ESD test. Node X includes the gates of n-channel transistors 50, 80, while node Y includes the gates of transistors 60, 82.

When a positive ESD pulse is applied to pin A or pin B with respect to the ground pin, the following events are thought to take place. Since resistor 86 (or resistor 84) connects gate node X (or node Y) to the p-substrate rather than to ground, when coupling capacitor 54 (or coupling capacitor 64) charges node X (or node Y), the ESD current starts to flow through resistor 86 (or resistor 84) and injects directly into the p-substrate thus effectively lowering the snapback voltages of transistors 50 or 60 respectively, compared to a traditional gate-driven approach. The direct injection of ESD current (holes) into the p-substrate as a way to lower the snapback voltage of an NMOS ESD protection structure. This is known as a substrate-triggering technique.

Shorting n-channel transistors 80, 82 ensure that the p-substrate under bus-switch transistor 10 remains close to ground, rather than floating. Thus transistor 10 has a higher snapback voltage of $BV_{CES}$ rather than the open-base $BV_{CEO}$. The substrate or parasitic base under bus-switch transistor 10 is driven to ground by shorting n-channel transistor 80, rather than left floating. The shorted-base breakdown voltage is usually higher than the open-base breakdown voltage. Thus transistor 10 is less likely to turn on during an ESD event and is less likely to be damaged from the high ESD current.

Resistor 86 connects gate node X to the p-substrate rather than to ground. Similarly, resistor 84 connects gate node Y to the p-substrate rather than to ground.

Ideally, the location of the substrate terminal of resistors 84, 86 should be laid out very close to the drains of transistors 50, 60 to improve the efficiency of the substrate triggering effect in lowering the snapback voltages of transistors 50 and 60 respectively.

Injecting current through resistor 86 into the p-substrate helps to lower the snapback voltage of transistor 50 due to the substrate-triggering effect during an ESD event. Once transistors 50, 58, 80 turn on, the ESD voltage on pin A is rapidly reduced as the ESD current is shunted to the metal ground bus, which itself is shorted to ground (through pin B) through cross-pin transistor 58. Injecting current into the substrate allows transistor 50 to snapback more uniformly, and at a lower voltage than bus-switch transistor 10 turns on, preventing current flow and damage through bus-switch transistor 10.

Figure 7:
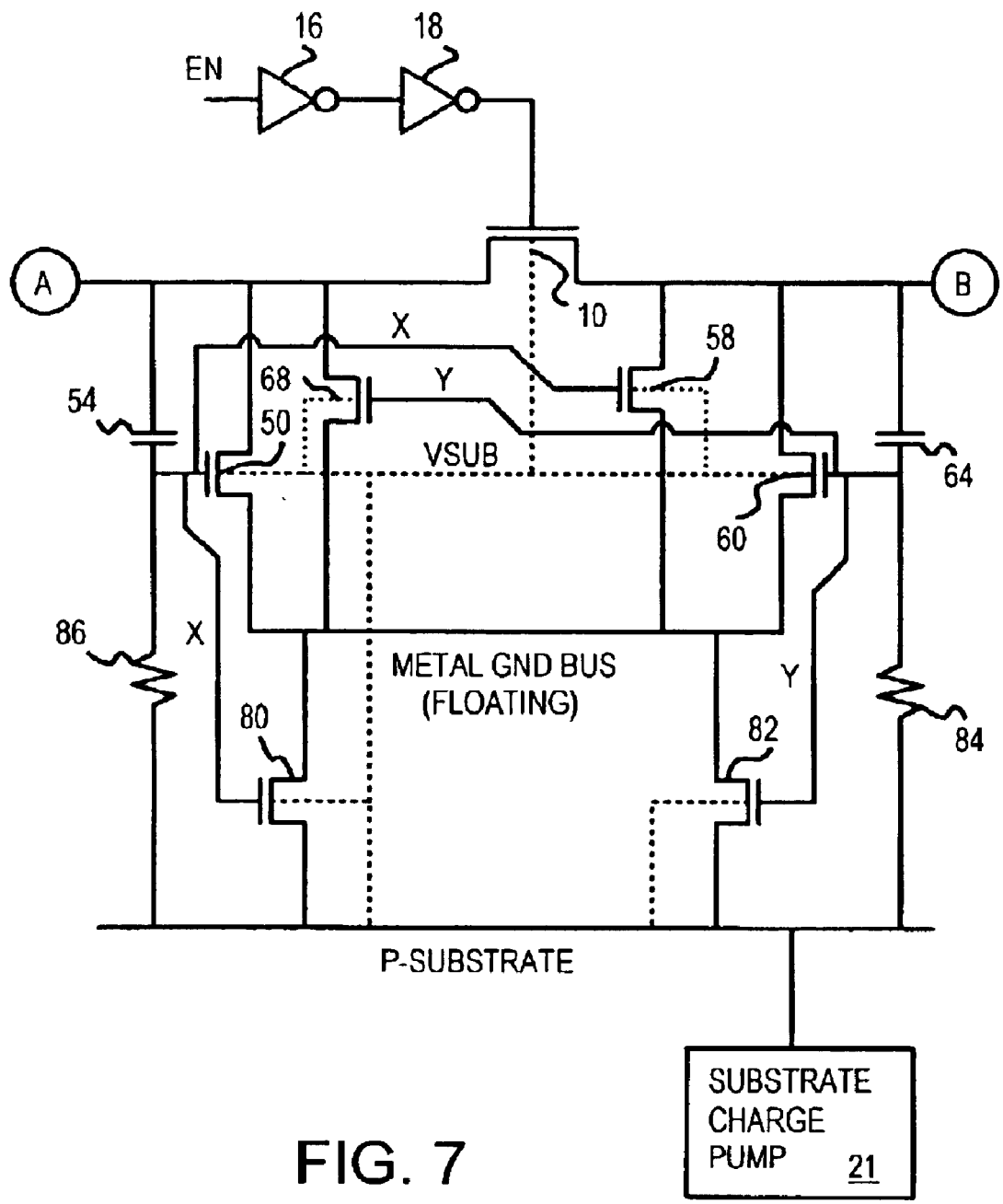
FIG. 7 is a diagram of a substrate-triggered ESD-protection device with cross-coupled activation.

FIG. 7 is a diagram of a substrate-triggered ESD-protection device with cross-coupled activation. When a positive ESD pulse is applied to pin A with respect to pin B (i.e. pin B is grounded), coupling capacitor 54 couples a sufficient voltage rise to node X to turn-on transistor 50. Transistor 50 operates in snapback mode. Transistors 80 and 58 also turn on. Likewise, when a positive ESD pulse is applied to pin B with respect to pin A (i.e. pin A is grounded), coupling capacitor 64 couples a sufficient voltage rise onto node Y to turn on transistors 60, 82 and 68.

The metal ground bus is connected to the ground pin of chip which floats during the pin-to-pin ESD test. The p-substrate is driven by the on-chip substrate charge pump and is not connected to any chip pin and thus floats during the ESD test.

Figure 8:
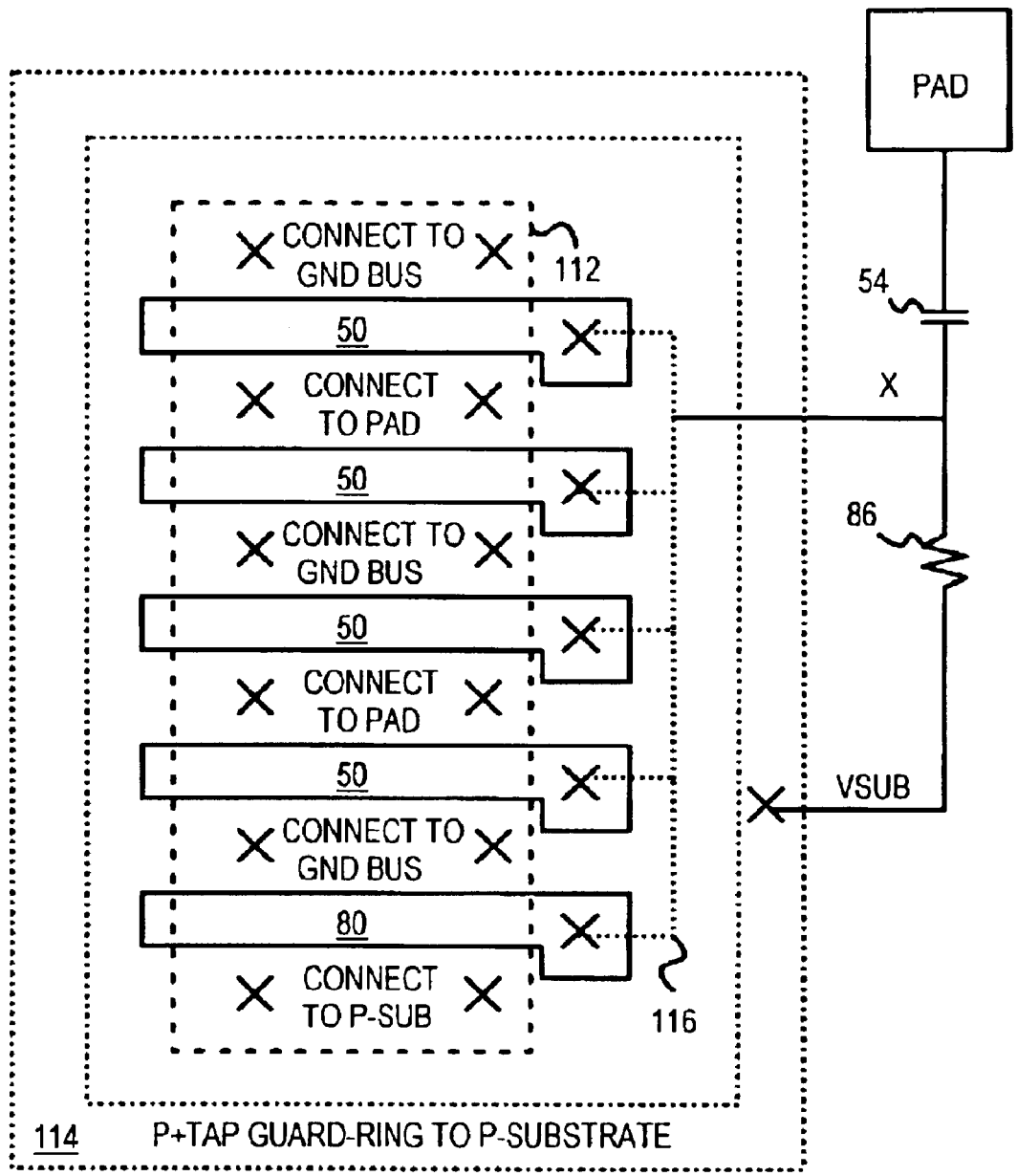
FIG. 8 is a diagram of the layout of the shunting and shorting transistors.

FIG. 8 is a diagram of the layout of the shunting and shorting transistors. Shunting transistor 50 can be divided into several legs of separate gate sections. In this example, shunting transistor 50 is sub-divided into four gates where polysilicon or other gate material crosses active region 112. Contacts to metal are shown as "X"'s. For example, contacts from active areas on one side of shunting transistor 50 connect to the pad, while the active areas on the other side of shunting transistor 50 connect to the ground bus, which is floating during some ESD tests.

Metal line 116 connects to the gates of shunting transistor 50 and shorting transistor 80. Poly-to-metal contacts can be used. Metal line 116 is part of node X, which is separated from the pad by coupling capacitor 54. Resistor 86 is coupled between node X and the p-substrate node.

A metal-to-active contact connects the far end of resistor 86 to p+ tap 114. P+ tap 114 can be a guard ring around active areas 112 of transistors 50, 80 (and transistor 58, not shown). P+ tap 114 is located within the p-type substrate under transistors 50, 58, 80 and thus provides electrical connection to the p-substrate. The source of shorting n-channel transistor 80 is also connected to the p-substrate by a metal line (not shown) or by a strap to p+ tap 114.

Figure 9:
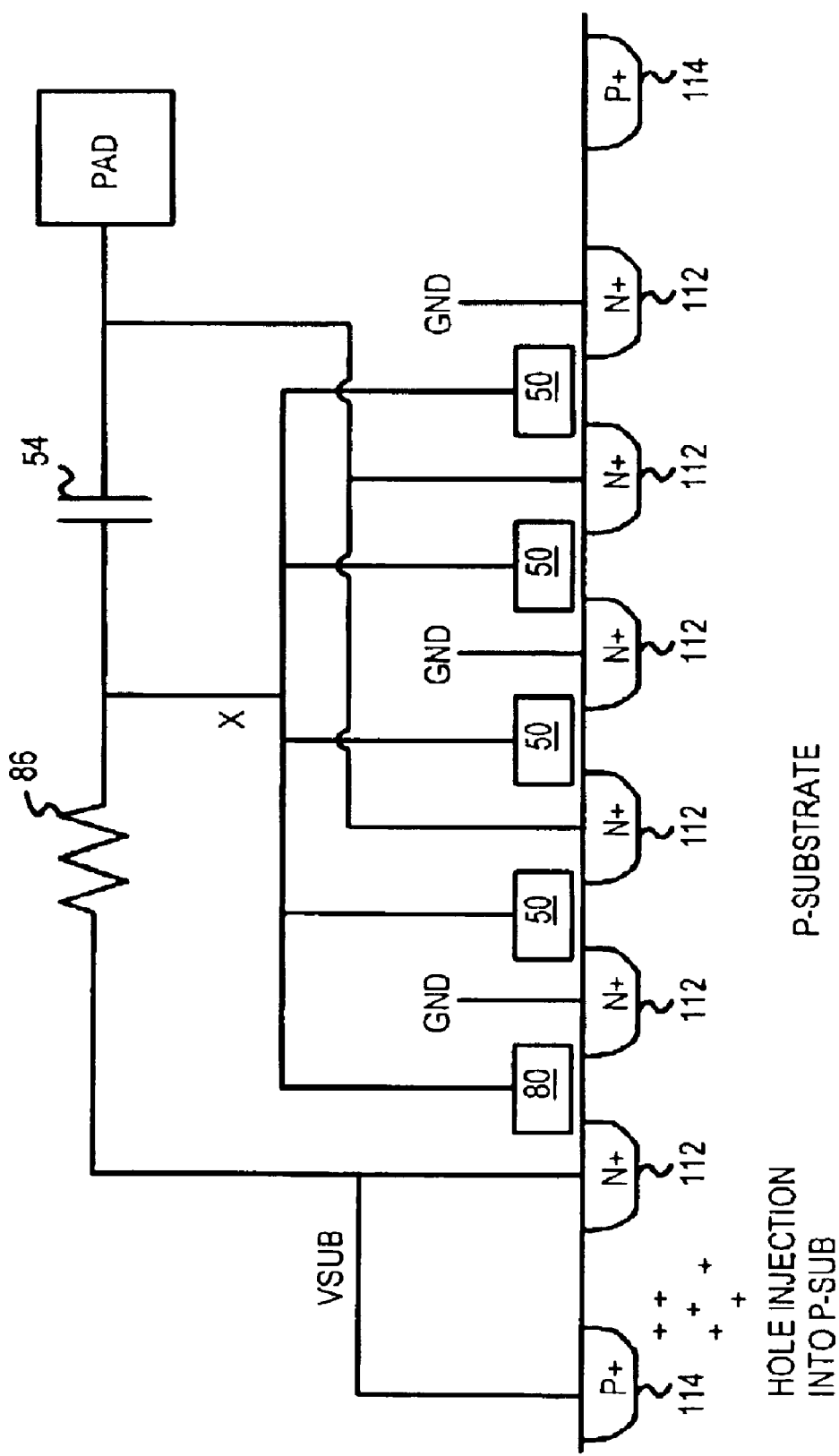
FIG. 9 is a cross-sectional diagram of the shunting and shorting transistors of FIG. 7.

FIG. 9 is a cross-sectional diagram of the shunting and shorting transistors of FIG. 8. Active areas 112 are formed by n+ regions in the p-substrate in between the gates of transistors 50, 58, 80. A guard ring is formed by p+ tap 114, which surrounds transistors 50, 58, 80. Positive carriers or holes are injected by p+ tap 114 into the p-substrate during some ESD events. These holes are current from the pad that is coupled through capacitor 54 and resistor 86.

The injected holes in the p-substrate make it easier to turn-on the base-emitter junction of the parasitic lateral NPN associated with the shunting transistor 50. This phenomenon is known as the substrate-triggering effect.

Another benefit of the substrate-injecting ESD-protection device is improved device characteristics for a VIK test measurement. During a VIK test, the integrated circuit is powered up, so that the internal ground bus is grounded and not floating. The substrate bias generator is also operational since power (Vcc) is applied. During the VIK test, 100 µ-amps of current is pulled out of an I/O pin and the pin's voltage measured. The VIK test can be used to distinguish between a chip with a substrate generator and one with a grounded substrate for sorting purposes.

During the VIK test, shunting transistor 50 remains off, since it's gate voltage is below ground. Resistor 86 connects its gate, node X, to the substrate rather than the ground bus. Since the substrate is pumped below ground, the gate of shunting transistor 50 is held below ground, such as at −2 volts. This lower gate voltage reduces the current leakage through shunting transistor 50, increasing the VIK voltage measured.

Also, during normal chip operation, nodes X, Y are held below ground by the resistors 84, 86 and substrate bias generator 21 pumping the p-substrate to about −2 volts. The −2 volts on the gates of transistors 50, 60 increases the input-noise guard-band on pins A, B, since transistors 50, 60 have a more negative gate voltage and have less conduction than if their gates were simply grounded.

Alternate Embodiments

Several other embodiments are contemplated by the inventors. For example various other ESD-protection circuits may be added, such as a gate-protection circuit that replaces the inverters driving the gate of the bus-switch transistor. In some other implementations, an on-chip charge pump is used to purposely over-drive the gate of the bus-switch transistor so as to get a higher current capability without using a larger size bus-switch transistor.

The shorting transistors could be replaced with bipolar transistors, as could the n-channel shunting transistors. The bases of the bipolar transistors replace the gates, since the bases control current flow between the collector and emitter. Of course, some current can flow through bipolar bases so the cross-gate node may be discharged more quickly. Diodes, resistors, capacitors, and other transistors could be added to the circuits. Additional protection devices could be added.

The invention could be applied to other types of IC chips rather than a bus switch chip. For example, a network switch might have a matrix of bus-switch transistors that connect input pins and output pins in a cross-bar manner, with an input connected to multiple outputs by multiple bus-switch transistors. Additional cross-grounding transistors could be added, one for each output pin, which are driven by the same gate node of the input pin's ESD protection device. The invention could also protect ordinary inputs, outputs, and I/O's that are not directly connected by bus-switch transistors, but are connected by ordinary logic gates.

P-channel rather than n-channel transistors could be used for n-type substrate or N-well processes. The invention may have P-wells rather than a p-type substrate, or may have dual-wells on either a p or n-type substrate. Buried layers could also be added.

The invention could be re-designed to connect to the internal power-supply bus rather than to the internal ground bus, and protect a p-channel bus-switch transistor. Both a p-channel and an n-channel ESD protection device could be used in parallel to protect a transmission gate bus switch.

Other kinds of transistors could also be used. Sizing of transistors and capacitors can be estimated and verified or adjusted based on simulation results. Each I/O pin could be an input, output, or a bi-directional pin. The "pin" may be a node connected to a pad or bonding pad or ball rather than to a traditional pin.

Many bus-switch transistors and isolation circuits can be integrated together on a single substrate and sold as a single chip. Other functions and circuits can be included on the chip. The pin can be a bonding pad on a semiconductor chip that is for connecting to a bonding wire or ball that electrically connects to a pin or connector of a package. The terms source and drain can change, depending on applied voltage biases. Current can be positive current or negative current flowing in an opposite direction.

The resistors 84, 86 could be replaced by other devices, such as transistors. The coupling capacitors can be implemented as p-channel or n-channel transistors each with the source and drain connected together as one terminal of the capacitor, and the transistor gate as the second capacitor terminal.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means".The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A pin-to-pin electro-static-discharge (ESD) protection device comprising:
   an input node that receives an ESD pulse;
   an internal ground bus;
   a substrate node;
   a coupling capacitor between the input node and a trigger node;
   a shunting transistor having a gate connected to the trigger node, for conducting current between the input node and the internal ground bus during an ESD event;
   a shorting transistor having a gate connected to the trigger node, for conducting current between the internal ground bus and the substrate node during the ESD event; and
   an injecting resistor, coupled between the trigger node and the substrate node, for injecting current into the substrate node during the ESD event, whereby portions of the ESD pulse are conducted to the internal ground bus and to the substrate node.

2. The pin-to-pin ESD protection device of claim 1 wherein the shunting transistor and the shorting transistor have bulk terminals that are the substrate node.

3. The pin-to-pin ESD protection device of claim 2 wherein the shunting transistor and the shorting transistor are n-channel transistors and the substrate node is a p-type substrate or a p-type well.

4. The pin-to-pin ESD protection device of claim 3 further comprising:
   a substrate bias generator, coupled to a power supply and to the internal ground bus, for biasing the substrate node to a voltage below a ground voltage of the internal ground bus when power is applied.

5. The pin-to-pin ESD protection device of claim 2 further comprising:

a second input node that receives a negative ESD pulse;

a second coupling capacitor between the second input node and a second trigger node;

a second shunting transistor having a gate connected to the second trigger node, for conducting current between the second input node and the internal ground bus during an ESD event, whereby the internal ground bus is grounded to the second input node by the second shunting transistor, and ESD current from the second input node is shunted to the internal ground bus by the second shunting transistor.

6. The pin-to-pin ESD protection device of claim 5 further comprising:

a second shorting transistor having a gate connected to the second trigger node, for conducting current between the internal ground bus and the substrate node during the ESD event.

7. The pin-to-pin ESD protection device of claim 6 further comprising:

a second injecting resistor, coupled between the trigger node and the substrate node, for injecting current into the substrate node during the ESD event.

8. The pin-to-pin ESD protection device of claim 7 further comprising:

a bus-switch transistor coupled to conduct current between the input node and the second input node during normal operation, but for isolating the input node from the second input node during the ESD event;

whereby the bus-switch transistor is protected from a positive ESD pulse by the shunting transistor and the shorting transistor.

9. The pin-to-pin ESD protection device of claim 8 wherein the bus-switch transistor has a bulk terminal connected to the substrate node, wherein the substrate node under the bus-switch transistor is triggered during the ESD pulse by current injected by the injecting resistor and by the shorting transistor, whereby snapback voltages of shunting transistors are lowered by a substrate-triggering effect.

10. The pin-to-pin ESD protection device of claim 9 wherein a parasitic NPN transistor is formed by an n-type source, the substrate node, and an n-type drain of the bus-switch transistor:

wherein substrate is p-type;

wherein a breakdown voltage of the parasitic NPN transistor of the bus-switch transistor is made more positive by the shorting transistor connecting the substrate node to the internal ground bus during the ESD event.

11. A bus-switch chip comprising:

a first input;

a second input;

a ground bus that is isolated from the first and second inputs;

bus-switch transistor means for conducting current between the first input and the second input when activated by an enable signal during normal operation;

first coupling means for coupling a portion of a first voltage shock applied to the first input to a first activating node;

first shunting means, responsive to the first activating node, for shunting current from the first input to the ground bus when the first coupling means couples the portion of the first voltage shock to the first activating node;

first shorting means, responsive to the first activating node, for shunting current from the ground bus to a substrate under the first shunting means and under the first shorting means when the first coupling means couples the portion of the first voltage shock to the first activating node; and second shunting means, responsive to a second activating node, for shorting the ground bus to the second input when the first coupling means couples the portion of the first voltage shock to the first activating node, whereby the first shunting means and the first shorting means are activated by the first activating node.

12. The bus-switch chip of claim 11 further comprising:

second coupling means for coupling a portion of a second voltage shock applied to the second input to the second activating node; and second shorting means, responsive to the second activating node, for shunting current from the ground bus to a substrate under the second shunting means and under the second shorting means when the second coupling means couples the portion of the second voltage shock to the second activating node;

whereby the second shunting means and the second shorting means are activated by the second activating node.

13. The bus-switch chip of claim 12 further comprising:

first injecting means for injecting current into the substrate, the first injecting means coupled between the first activating node and the substrate but not connected to the ground bus; and second injecting means for injecting current into the substrate, the second injecting means coupled between the second activating node and the substrate but not connected to the ground bus.

14. The bus-switch chip of claim 12 wherein the first shorting means comprises a first n-channel transistor means for conducting current between the ground bus and the substrate when the first activating node receives the portion of the first voltage shock, wherein the first activating node is a gate of the first n-channel transistor means; and wherein the second shorting means comprises a second n-channel transistor means for conducting current between the ground bus and the substrate when the second activating node receives the portion of the second voltage shock, wherein the second activating node is a gate of the second n-channel transistor means.

15. The bus-switch chip of claim 14 wherein the first shunting means comprises a third n-channel transistor means for conducting current between the first input and the ground bus when the first activating node receives the portion of the first voltage shock, wherein the first activating node is a gate of the third n-channel transistor means;

wherein the second shunting means comprises a fourth n-channel transistor means for conducting current between the second input and the ground bus when the second activating node receives the portion of the second voltage shock, wherein the second activating node is a gate of the fourth n-channel transistor means.

16. The bus-switch chip of claim 15 wherein the substrate is a p-type substrate or one or more p-wells under channels of the first, second, third, and fourth n-channel transistor means.

17. An electro-static-discharge (ESD) protection circuit comprising:

an internal bus;

a bus-switch transistor having a gate driven by an enable signal, a drain coupled to a first input, a source coupled to a second input, and a substrate coupled to a substrate node;

a first capacitor between the first input and a first gate node;

a first shunt transistor having the first gate node as its gate, a drain coupled to the first input and a source coupled to the internal bus;

a first shorting transistor having the first gate node as its gate, a drain coupled to the internal bus and a source coupled to the substrate node;

a first cross-pin transistor having the first gate node as its gate, a drain coupled to the second input, and a source coupled to the substrate node; and injecting means, coupled between the first gate node and the substrate node, for injecting into the substrate node current from an ESD pulse applied to the first input.

18. The ESD protection circuit of claim 17 further comprising:

a second capacitor between the second input and a second gate node;

a second shunt transistor having the second gate node as its gate, a drain coupled to the second input and a source coupled to the internal bus;

a second shorting transistor having the second gate node as its gate, a drain coupled to the internal bus and a source coupled to the substrate node;

a second cross-pin transistor having the second gate node as its gate, a drain coupled to the first input, and a source coupled to the substrate node; and second injecting means, coupled between the second gate node and the substrate node, for injecting into the substrate node current from an ESD pulse applied to the second input.

19. The ESD protection circuit of claim 18 further comprising:

wherein the injecting means is a first resistor or a transistor coupled between the first gate node and the substrate node.

20. The ESD protection circuit of claim 17 wherein the bus-switch transistor is an n-channel transistor, the first and second shunt transistors are n-channel transistors and the first and second shorting transistors and the first and second cross-pin transistors are n-channel transistors all having bulk terminals connected to the substrate node.

* * * * *